United States Patent

[11] 3,622,899

[72] Inventor Mark F. Eisenberg
North Plainfield, N.J.
[21] Appl. No. 823,034
[22] Filed May 8, 1969
[45] Patented Nov. 23, 1971
[73] Assignee Hewlett-Packard Company
Palo Alto, Calif.

[54] HIGH-VOLTAGE POWER AMPLIFIER CIRCUIT
7 Claims, 2 Drawing Figs.

[52] U.S. Cl. .................... 330/22, 330/15, 330/17, 330/18, 330/24
[51] Int. Cl. .................... H03f 3/04
[50] Field of Search .................... 330/13, 15, 17, 18, 22, 24, 30, 134, 207 P

[56] References Cited

UNITED STATES PATENTS

| | | | |
|---|---|---|---|
| 2,888,525 | 5/1959 | Eckess et al. | 330/13 |
| 3,225,209 | 12/1965 | Schuster | 330/15 X |
| 3,262,062 | 7/1966 | Langan | 330/24 |
| 3,373,370 | 3/1968 | Letsinger | 330/24 |
| 3,421,098 | 1/1969 | Fisher | 330/15 |

*Primary Examiner*—Roy Lake
*Assistant Examiner*—Lawrence J. Dahl
*Attorney*—Stephen P. Fox

ABSTRACT: A power amplifier circuit is capable of providing high-frequency output signals over a wide voltage range. At least two transistors are coupled in series to a load terminal and the transistors are energized by respective voltage sources having different magnitudes. The transistors are biased so that they operate as amplifiers in sequence in response to an input signal of increasing magnitude. The overall power dissipation in the circuit is low for a wide range of output signals.

PATENTED NOV 23 1971 3,622,899

INVENTOR.
MARK F. EISENBERG
BY
Stephen P. Fox
AGENT

HIGH-VOLTAGE POWER AMPLIFIER CIRCUIT

BACKGROUND OF THE INVENTION

It is often required that transistor amplifiers be designed to provide high-frequency operation over a wide voltage range extending to voltages on the order of 30 volts and more. One typical application of such an amplifier is in a deflection circuit which drives the yoke coils of a cathode-ray tube (CRT). Both low and high voltage output signals may be required to deflect the CRT beam. For example, low voltage signals may provide DC positioning or slow beam tracing; whereas high-voltage signals may be needed to provide faster beam tracing or beam flyback. It is preferable that both low and high voltage beam control signals be amplified linearly. In addition, rapid transitions between low and high level signals are generally required, so that high-frequency transistors must be used.

Heretofore, in many prior art amplifier circuits, the above-described capabilities have been achieved with a transistor amplifier wherein a power transistor in the output stage is coupled to a high-voltage power source and controlled in an amplifying mode to provide both low and high-voltage output signals. This arrangement results in linear amplification of both low and high level signals; however, in a DC mode of operation, the output transistor may have almost the full supply voltage applied across it at the same time that it supplies maximum load current. This is because the yoke coils constitute an inductive load having a low DC resistance with a resulting low-voltage drop across them. Therefore, the use of a high power output transistor has been required. In addition to having a high power dissipation rating, the output transistor often must operate at high frequencies. High power, high-frequency transistors for this purpose are costly and economically impractical in many circuit applications.

The aforementioned problems are compounded in transistor amplifiers responsive to bipolar signals. In a typical prior art circuit configuration used as a deflection amplifier in a CRT yoke driving circuit, a pair of complementary conductivity output transistors are connected between positive and negative supply voltages for push-pull operation to apply both positive and negative signals to a common output. Each output transistor amplifies one polarity of the input signal. When one of these transistors is amplifying, the other transistor is nonconducting and must withstand the sum of the magnitudes of the positive and negative supply voltages. Thus, each of the pair of output transistors should have a high voltage rating in addition to high power and high-frequency capabilities.

SUMMARY OF THE INVENTION

The present invention relates to a transistor amplifier circuit which is operable to provide linear amplification of both low and high-voltage signals with a low-frequency response. An object of the invention is to provide this capability with the use of inexpensive transistors having low power rather than high power dissipation ratings.

In accordance with one illustrated embodiment of the invention, two symmetrically configured transistor circuits are arranged for push-pull operation as a high power output amplifier utilizable for example to drive the yoke coils of a CRT. Each of the symmetrical circuits includes first and second transistors which are coupled in series to a common output terminal and are energizable from respective low and high voltage sources. An input control signal is coupled in parallel to the two transistors through a diode biasing network. The first transistor operates from the low voltage source to amplify input signals below a predetermined level. During this time the second transistor is biased to conduct only a small idling current. When the input signal exceeds the aforementioned predetermined level, the first transistor conducts with a small voltage drop across it and the second transistor operates from the high-voltage source to amplify the input signal and to apply an output signal through the first transistor to the common output terminal. The small idling current conducted by the second transistor when it is not operating in the amplifying mode permits rapid transition between active operation of the first and second transistors and eliminates cross-over distortion during this transition. The combination of the two transistors will amplify both low and high level signals with high efficiency, and each transistor need have only a low power dissipation rating.

The scope of the present invention extends to circuit combinations including more than two series-coupled transistors. In other embodiments, three or more transistors may be coupled in series and energized from separate voltage sources having incrementally related magnitudes. In effect, successive ones of the series coupled transistors operate in sequence and each transistor amplifies the input signal when it falls within a predetermined voltage range. When any one of the transistors is in an amplifying mode, the transistors which amplify at lower signal levels remain heavily conducting with low voltage drops across them and the transistors which amplify at higher signal levels remain essentially nonconducting.

DESCRIPTION OF THE PREFERRED EMBODIMENT

Figure 1:
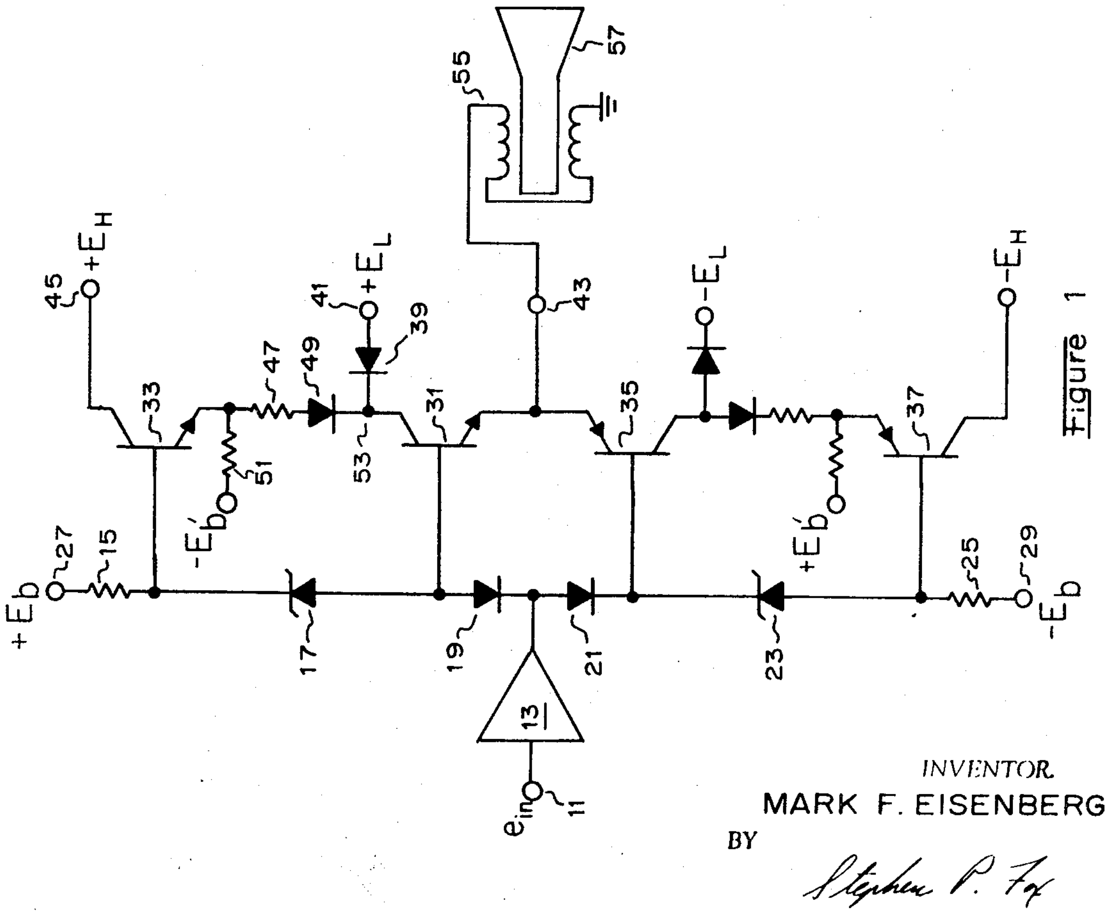
FIG. 1 is a schematic diagram of one embodiment of the present invention in a push-pull bipolar deflection amplifier circuit used for driving the yoke coils of a cathode-ray tube.

Referring now to FIG. 1, there is provided an input terminal 11 for receiving a bipolar input signal $e_{in}$. This signal is applied through a driving amplifier 13 to two symmetrically configured transistor circuits arranged for push-pull operation. The input signals are applied through a coupling and biasing network in the form of a voltage divider including a resistor 15, zener diode 17, diodes 19 and 21, a zener diode 23, and resistor 25. This voltage divider is connected to a pair of end terminals 27, 29, which in turn are connected respectively to positive and negative biasing potentials $\pm E_b$ having equal magnitudes. The zener diodes 17, 23 and the diodes 19, 21 are poled so that they are maintained conducting by the biasing potentials $\pm E_b$.

The bipolar input signals are applied to the common junction point of diodes 19, 21. Positive going input signals control two NPN-type transistors 31 and 33 through diode 19 and zener diode 17; whereas negative going input signals control two PNP-transistors 35 and 37 through diode 21 and zener diode 23. The configuration and operation of the circuitry including transistors 31, 33 is similar to that including transistors 35, 37. Therefore, the subsequent detailed description will be referenced to the amplification of positive going signals, it being understood that the amplification of negative going signals is achieved in a similar manner.

Transistor 31 has its collector and emitter electrodes connected in a series current path with a diode 39 between a power terminal 41 and a common output terminal 43. The power terminal 41 is connected to a low-voltage source $+E_L$ having a magnitude on the order of 12 volts, for example. Transistor 33 has its collector and emitter electrodes connected in a series current path from a power terminal 45 through a resistor 47 and diode 49, and thence through transistor 31 to the common output terminal 43. The power terminal 45 is coupled to a second voltage source, $+E_H$, having a magnitude higher than the first voltage source $+E_L$, and on the order of 30 volts, for example.

Considering now the operation of transistors 31 and 33, the base control electrode of transistor 31 is biased at a few tenths of a volt, as determined by the diode 19. The base electrode of transistor 33 is biased at a predetermined voltage level above that of transistor 31 by the zener diode 17. Zener diode 17 is selected with a breakdown voltage such that the voltage applied to the base of transistor 33 is equal to the sum of the minumum voltage desired to be maintained across transistor 31 plus the voltage drops across diode 49, resistor 47 and the emitter-tolbase voltage of transistor 33.

When a positive going input signal having a magnitude less than a predetermined voltage level is applied to terminal 11, transistor 31 conducts in an amplifying mode and is energized by the voltage source $+E_L$ applied to the power terminal 41. An amplified signal is applied through the emitter electrode of transistor 31 to the common output terminal 43 and thence to the load. At this time, transistor 33 is in an essentially nonconducting mode with a small idling current being maintained therethrough, due to a negative bias potential $-E_b'$ applied to the emitter electrode of transistor 33 through a resistor 51. The voltage at the base electrode of transistor 33 follows the input signal $e_{in}$ and is less than the voltage $+E_L$; however, this voltage relationship does not reverse bias the base-emitter junction of transistor 33 because diode 49 is reverse biased instead, thus blocking the voltage $+E_l$ from the emitter electrode of transistor 33.

When the input signal $e_{in}$ increases positively above the aforementioned predetermined voltage level, transistor 31 conducts more heavily and its emitter-collector voltage drops to a predetermined minumum value. At this time, transistor 33 begins to conduct in an amplifying mode. The voltage at the junction point 53 is equal to the sum of the voltage drops across transistor 31 and the load connected to the output terminal 43. The voltage at this junction point increases as the current through transistor 31 and the load increases and eventually exceeds the voltage $+E_L$, thus causing diode 39 to be reverse biased and thereby effectively electrically disconnecting the voltage source $+E_L$ from the circuit. The signals amplified by transistor 33 are referenced to the higher voltage source $+E_H$ and are conducted through resistor 47, diode 49, and transistor 31 to the output terminal 43 and thence to the load.

The predetermined voltage level of the input signal for which signal amplification transfers from transistor 31 to transistor 33 can be set by selecting the breakdown voltage of zener diode 17. In effect, transistors 31, 33 operate in sequence, with transistor 31 amplifying low level input signals, and transistor 33 amplifying higher level signals. Amplification of low and high level signals by the respective transistors is linear. The fact that transistor 33 conducts an idling current while transistor 31 operates in an amplifying mode enables operation to be transferred rapidly between transistors 31 and 33 with minimum crossover distortion. When transistor 31 is operating in an amplifying mode, the maximum voltage applied between its collector and emitter electrodes is the voltage $+E_L$, and when transistor 33 is amplifying, the voltage applied thereacross is the voltage $+E_H$ minus the voltage drop across the load and transistor 31. Since the voltage drops across each of these transistors is maintained at low levels while they are conducting, the power dissipation by each is small compared to the total power delivered to the load through the output terminal 43.

Positive going input signals are also applied to the base control electrodes of transistors 35, 37 through the conducting diode 21 and zener diode 23. However, transistors 35, 37 are of the PNP-type and are of complementary conductivity with respect to transistors 31, 33. Therefore, transistors 35, 37 will be reverse biased during the presence of positive going input signals and thus will be nonconducting. As noted hereinabove, the configuration and operation of the circuitry including transistors 35, 37 is substantially similar to that including transistors 31, 33. When a negative going input signal is applied to the junction between diodes 19, 21, the two transistors 35, 37 operate in a manner similar to that described above to provide amplified negative signals through the output terminal 43 to the load, and the two transistors 31, 33 remain nonconducting.

In the embodiment illustrated in FIG. 1, the load connected to terminal 43 is the yoke coil of a cathode ray tube (CRT). The push-pull amplifier operates to deflect the beam of the CRT in accordance with the input signal $e_{in}$. Slow beam deflection rates are achieved by the low-voltage amplifier transistor 31; whereas higher beam deflection rates during flyback, for example, are achieved by amplifier transistor 33. As stated above, crossover distortion between the operation of transistors 31 and 33 is minimized. Therefore, transient conditions such as beam bouncing on the face of the CRT are substantially eliminated.

Figure 2:
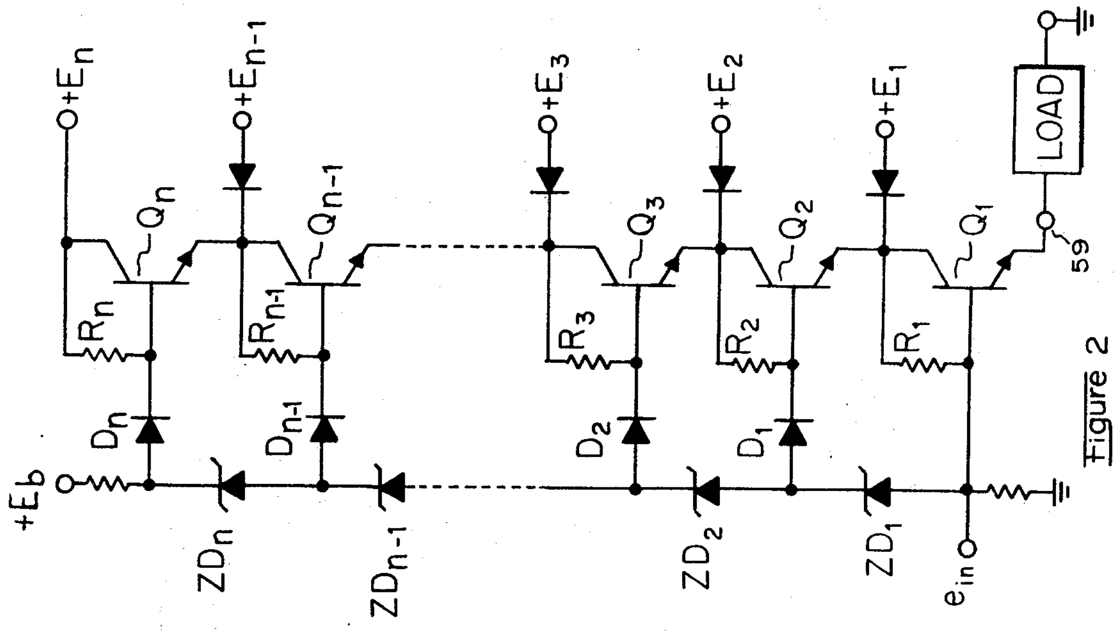
FIG. 2 is a schematic diagram of another embodiment of the invention for amplification of unipolar signals.

Referring now to FIG. 2, there is shown another circuit embodiment incorporating the present invention. The amplifier of this embodiment differs from that of FIG. 1 in that it amplifies input signals of one polarity, namely, positive going signals; however, alternatively, negative going input signals may be amplified if opposite conductivity type transistors are used and if the polarity of the supply and bias voltages is reversed. The circuit of FIG. 2 also differs from that of FIG. 1 in that more than two output transistors are employed for amplification. Instead, the circuit includes a plurality of output transistors $Q_1$ through $Q_n$, each of which is energized from a corresponding power source $+E_1$ through $+E_n$ having a relationship wherein $E_1<E_2<E_3 \ldots <E_n$. These voltage sources are applied through respective power terminals and diodes to the corresponding electrodes of the output transistors. There is also provided a voltage divider biasing network including a plurality of zener diodes $ZD_1$ through $ZD_n$ and having a plurality of tap points coupled to the base control electrodes of transistors $Q_1$ through $Q_n$.

An input signal $e_{in}$ applied to the voltage divider network drives each of the transistors sequentially in an amplifying mode in a manner similar to that described above with respect to FIG. 1. More specifically, input signals below a first predetermined low voltage level bias transistor $Q_1$ in an amplifying mode. This transistor is energized by the voltage $+E_1$ to produce an amplified output signal at the output terminal 59 which is connected to a load. At this time, transistors $Q_2$ through $Q_n$ are maintained in essentially a nonconducting mode and are biased with a small idling current therethrough by the corresponding resistors $R_2$ through $R_n$. Also, the base-emitter junctions of transistors $Q_2$ through $Q_n$ are prevented from being reverse biased by the action of the corresponding diodes $D_1$ through $D_n$ which are reverse biased instead and which operate in a manner similar to diode 49 in FIG. 1, as described above.

As the input signal $e_{in}$ increases above the first predetermined voltage level associated with transistor $Q_1$, the voltage drop across this transistor reaches its minimum value and diode $D_1$ becomes forward biased to drive transistor $Q_2$ in an amplifying mode to thereby drive the load with amplified output signals referenced to the higher supply voltage $+E_2$. When the input signal increases still further, above a second predetermined voltage level associated with transistor $Q_2$, the voltage drop across the latter transistor also reaches its minimum value and the next transistor $Q_3$ begins to operate in an amplifying mode under control of input signals received through diode $D_2$.

It can be seen that as the input signal increases, the transistors $Q_1$ through $Q_n$ operate in sequence to amplify input signals within the particular input voltage increment associated with each transistor. The predetermined voltage levels at which one transistor will reach its lowest collector-to-emitter voltage and the next transistor begins conducting in an amplifying mode is determined by the breakdown voltages of the zener diodes $ZD_1$ through $ZD_n$. As the input signal increases, the voltage sources $E_1$, $E_2$, etc., are successively electrically disconnected from the output circuit by their corresponding diodes and the amplified output signal is referenced to the next higher voltage source. The voltage drop across any one transistor is limited to the magnitude of the voltage applied to its collector less the sum of the voltage magnitudes across the load and the preceding transistors in the series circuit to the output terminal 59. Thus, the power dissipation in each transistor is maintained at a low level, even though high power output signals are applied to the load.

It is to be noted that in FIG. 2 the small idling current conducted by transistors $Q_1$ through $Q_n$ is maintained by the collector-to-base resistors $R_1$ through $R_n$; and the base-emitter junctions of these transistors $Q_2$ through $Q_n$ are protected from being reverse biased by the base circuit diodes $D_1$ through $D_n$. The alternative arrangement for accomplishing these functions is shown in FIG. 1, wherein the idling current is maintained by the biasing voltages $\pm E_b'$ and the corresponding series resistors (e.g., resistor 51); and the base-emitter junctions are protected from being reverse biased by emitter diodes (e.g., diode 49). Due to this difference in biasing arrangements, the circuit of FIG. 1 has a faster response time than the circuit of FIG. 2; however, the transistors in FIG. 1 are subjected to higher collector-to-emitter voltages than those in FIG. 2. The biasing combination of resistor $R_n$ and diode $D_n$ in FIG. 2 may be substituted for the combination of voltage $E_b'$, resistors 51, 47 and diode 49 in FIG. 1, if desired.

An advantage of the circuit of FIG. 2 is that the maximum voltage applied to any one transistor is equal to the difference between the supply voltages $E_n$ and $E_n{}^{'7E'}{}_1$ applied respectively to its collector and emitter electrodes. A large number of transistors may be connected in series in this manner to provide a high-voltage amplifier with an output capability ranging up to several hundred volts or more.

Various modifications may be made in the embodiments of FIGS. 1 and 2 without departing from the scope of the invention as defined in the following claims. For example, the overall amplification factor of the circuits may be increased by the addition of intermediate transistors in a "Darlington" configuration between the base control input of each output transistor and the corresponding tap point on the voltage divider biasing network. Also, the input signal $e_{in}$ may be applied to different tap points of the voltage divider network and may be either a single or double-ended input.

I claim:

1. An amplifier circuit comprising:
- a load terminal;
- a first power terminal connectable to a first predetermined voltage source;
- a plurality of transistors each having a pair of main current carrying electrodes and a base control electrode, said main current carrying electrodes of said transistors being coupled in a series current path between said load terminal and said first power terminal;
- a plurality of intermediate power terminals coupled respectively to the junction points between the main current carrying electrodes of said transistors, said intermediate power terminals being connectable in succession from said first power terminal to voltage sources having predetermined magnitudes incrementally decreasing from said first predetermined voltage source;
- asymmetrically conducting means coupled between each of said intermediate power terminals and the corresponding one of said junction points between the main current carrying electrodes of said transistors, each of said asymmetrically conducting means being nonconductive when the voltage at the corresponding junction point exceeds the voltage at the corresponding power terminal;
- means coupled to the base control electrodes of said plurality of transistors for applying an input signal to said base control electrodes, said signal-applying means including voltage divider means connectable between a source of bias potential and a reference potential, said voltage divider means having a plurality of tap points coupled respectively to the control inputs of said transistors, thereby to cause said transistors to respond to input signals above predetermined incrementally related threshold levels associated respectively with said transistors;
- means coupled to said transistors for biasing each of said transistors to conduct an idling current when input signals are below the predetermined signal threshold level associated with each transistor, and to conduct in an active mode in response to input signals above the associated one of said predetermined signal threshold levels, said biasing means including:
  - impedance means coupled between one main current carrying electrode and the base control electrode of each of said plurality of transistors; and
  - asymmetrically conducting means connected between the base control electrode of each of said transistors and said voltage divider means, said last named asymmetrically conducting means being poled to protect its corresponding transistor from reverse voltage breakdown;
- thereby to activate said transistors in sequence without crossover distortion as the input signal increases in magnitude.

2. The amplifier circuit of claim 1,
- said signal-applying means including an input terminal coupled to a predetermined one of said tap points for receiving an input signal.

3. The amplifier circuit of claim 1, said voltage divider means including a plurality of zener diodes connected respectively between successive ones of said tap points.

4. In an amplifier circuit including a common output terminal connected to a load and two symmetrically configured transistor circuits adapted for push-pull operation to apply bipolar output signals to said common terminal in response to bipolar input signals, the improvement wherein each of said two transistor circuits comprises:
- a first power terminal coupled to a power source having a first predetermined voltage magnitude;
- a first transistor having a base control electrode, and a pair of main current carrying electrodes coupled respectively to said first power terminal and said common output terminal;
- a second power terminal coupled to a power source having a second predetermined voltage magnitude larger than said first predetermined voltage magnitude;
- a second transistor having a base control electrode, and a pair of main current carrying electrodes coupled respectively to said second power terminal and the main current carrying electrode of said first transistor that is coupled to said first power terminal;
- an asymmetrically conducting element in series with the coupling between said first power terminal and the associated main current carrying electrodes of said first and second transistors, said asymmetrically conducting element being reverse biased when the voltage at said associated main current carrying electrodes exceeds in magnitude the voltage applied to said first power terminal;
- means for biasing said first and second transistors respectively in amplifying and substantially nonconducting modes when the amplified output signal levels produced are less than the voltage magnitude applied to said first power terminal, and for biasing said first and second transistors respectively in voltage limited and amplifying modes when the output signal levels produced are between the voltage magnitudes applied to said first and second power terminals, said biasing means including:
  - asymmetrically conducting means coupled in series with the particular one of the main current carrying electrodes of said second transistor that is coupled to said first power terminal, said asymmetrically conducting means being poled to protect said second transistor from reverse-voltage breakdown when said second transistor is in a nonconducting mode; and
  - means for coupling said particular one of the main current carrying electrodes of said second transistor to a potential source to cause an idling current to be conducted through said second transistor when it is in said substantially nonconducting mode, thereby preventing crossover distortion when signal amplification transfers between said first and second transistors.

5. The amplifier circuit of claim 4, further including means for applying said input signals to said amplifier circuit comprising:
- two end terminals connectable respectively to a source of input signals and a source of bias voltage;

at least two asymmetrically conducting elements coupled in series between said two end terminals; and means for coupling the base control electrodes of said first and second transistors to selected electrodes of said two asymmetrically conducting elements.

6. The amplifier circuit of claim 5, wherein at least one of said two asymmetrically conducting elements is a zener diode.

7. The amplifier of claim 4, wherein said first and second transistors are of like conductivity type and the transistors of said two symmetrically configured transistor circuits are of complementary conductivity type.

* * * * *

UNITED STATES PATENT OFFICE
CERTIFICATE OF CORRECTION

Patent No. 3,622,899 Dated November 23, 1971

Inventor(s) Mark F. Eisenberg

It is certified that error appears in the above-identified patent and that said Letters Patent are hereby corrected as shown below:

Column 1, line 54, "low-frequency response" should read -- high frequency response --;

Column 3, line 2, "emitter-tolbase" should read -- emitter-to-base --; line 17, "$+E_1$" should read -- $+E_L$ --;

Column 5, line 18, "$E_n$ '7E' $_1$" should read -- $E_{n-1}$ --.

Signed and sealed this 2nd day of May 1972.

(SEAL)
Attest:

EDWARD M.FLETCHER,JR.
Attesting Officer

ROBERT GOTTSCHALK
Commissioner of Patents